(12) United States Patent
Tustaniwskyj et al.

(10) Patent No.: US 7,199,597 B2
(45) Date of Patent: Apr. 3, 2007

(54) DUAL FEEDBACK CONTROL SYSTEM FOR MAINTAINING THE TEMPERATURE OF AN IC-CHIP NEAR A SET-POINT

(75) Inventors: Jerry Ihor Tustaniwskyj, Mission Viejo, CA (US); James Wittman Babcock, Escondido, CA (US)

(73) Assignee: Delta Design, Inc., Poway, CA (US)

( * ) Notice: Subject to any disclaimer, the term of this patent is extended or adjusted under 35 U.S.C. 154(b) by 237 days.

(21) Appl. No.: 10/780,417

(22) Filed: Feb. 16, 2004

(65) Prior Publication Data

US 2007/0013394 A1 Jan. 18, 2007

(51) Int. Cl.
*G01R 31/02* (2006.01)
(52) U.S. Cl. ...................... 324/760; 165/80.3
(58) Field of Classification Search ............... 165/80.3; 324/760
See application file for complete search history.

(56) References Cited

U.S. PATENT DOCUMENTS

| | | | |
|---|---|---|---|
| 5,271,239 A * | 12/1993 | Rockenfeller et al. ..... | 62/259.2 |
| 5,812,505 A | 9/1998 | Shimoda et al. | |
| 6,184,504 B1 * | 2/2001 | Cardella ..................... | 219/513 |
| 6,257,319 B1 * | 7/2001 | Kainuma et al. .......... | 165/11.1 |
| 6,362,944 B1 | 3/2002 | Tustaniwskyj et al. | |
| 6,711,961 B2 * | 3/2004 | Theriault et al. .......... | 73/865.6 |
| 6,802,368 B2 * | 10/2004 | Getchel et al. ............. | 165/206 |
| 2002/0062954 A1 | 5/2002 | Getchel et al. | |
| 2003/0217558 A1 | 11/2003 | Wall et al. | |

* cited by examiner

*Primary Examiner*—Jermele Hollington
*Assistant Examiner*—Arleen M. Vazquez
(74) *Attorney, Agent, or Firm*—Foley & Lardner LLP

(57) ABSTRACT

A dual feedback control system maintains the temperature of an IC-chip near a set-point while the IC-chip dissipates a varying amount of electrical power. The first feedback circuit sends electrical power to an electric heater with a variable magnitude that compensates for changes in the IC-chip power. The second feedback circuit passes a liquid refrigerant to an evaporator, which is connected to the heater, with a variable flow rate that reduces electrical power usage in the heater over that which occurs if the flow rate is fixed.

16 Claims, 6 Drawing Sheets

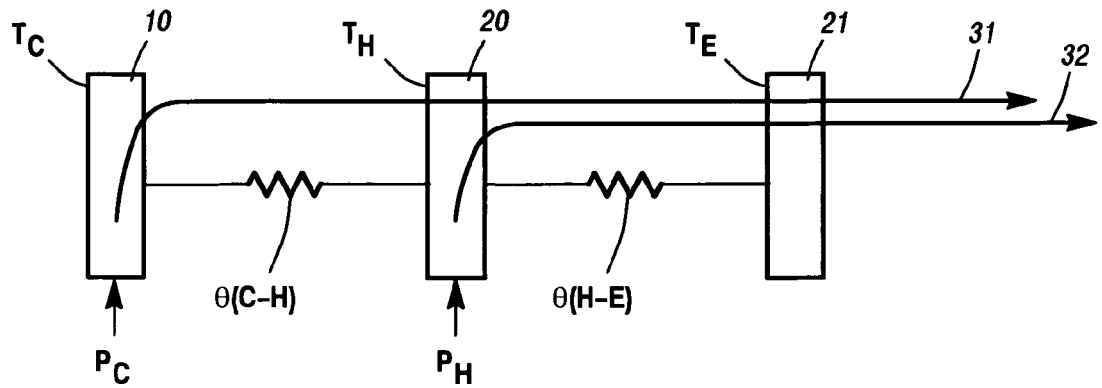
*Figure 2*
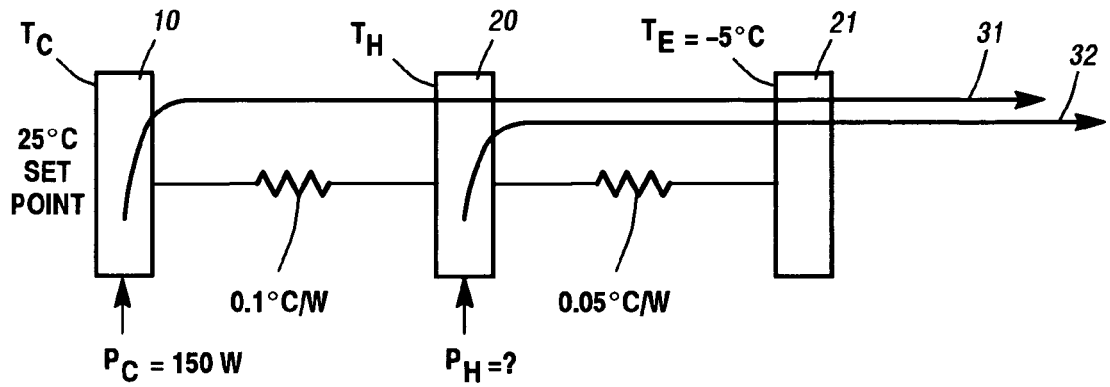
*Figure 3*
eq. 1 → $T_C - T_E = P_C [\theta(C-H) + \theta(H-E)] + P_H [\theta(H-E)]$
eq. 2 → $25 - (-5) = 150 (0.1 + 0.05) + P_H (0.05)$
eq. 3 → $30 = 22.5 + 0.05 P_H$
eq. 4 → $P_H = 150$ watts
*Figure 4* eg. 10 → 25 − (−5) = 70 (0.1 + 0.05) + $P_H$ (0.05)

eg. 11 → 30 = 10.5 + 0.05 $P_H$ eg. 12 → $P_H$ = 390 watts ↔ too big eg. 13 → CONTROL CKT 27 SETS $T_E$ = + 7°C eg. 14 → 25 − (+7) = 70 (0.1 + 0.05) + $P_H$ (0.05)

eg. 15 → 18 = 10.5 + 0.05 $P_H$ eg. 16 → $P_H$ = 150 watts eg. 20 → 40 − (−5) = 150 (0.1 + 0.05) + $P_H$ (0.05)

eg. 21 → 45 = 22.5 + 0.05 $P_H$ eg. 22 → $P_H$ = 450 watts ↔ too big eg. 23 → CONTROL CKT 27 SETS $T_E$ = + 10°C eg. 24 → 40 − (10) = 150 (0.1 + 0.05) + $P_H$ (0.05)

eg. 25 → 30 = 22.5 + 0.05 $P_H$ eg. 26 → $P_H$ = 150 watts

DUAL FEEDBACK CONTROL SYSTEM FOR MAINTAINING THE TEMPERATURE OF AN IC-CHIP NEAR A SET-POINT

BACKGROUND OF THE INVENTION

Complex IC-chips (integrated circuit chips) are subjected to several tests as they are manufactured to both determine their functionality and to insure their future reliability. A "wafer" test is usually performed first. During this test, individual IC-chips in the wafer are probed. This is a quick test in which only certain types of defects in the IC-chips are detected. Thermal control during the wafer test is typically achieved simply with a cold plate that contacts the wafer.

The next test, which takes place after the IC-chips chips are packaged, is called "burn-in". The burn-in test thermally and electrically stresses the IC-chips to accelerate "infant mortality" failures. The stressing causes immediate failures that otherwise would occur during the first 10% of the IC-chips' life in the field, thereby insuring a more reliable product for the customer. The burn-in test can take many hours to perform, and the temperature of the IC-chip typically is held in the 100° C. to 140° C. range. Because the IC-chips are also subjected to higher than normal voltages, the power dissipation in the IC-chip can be significantly higher than in normal operation. This extra power dissipation makes the task of controlling the temperature of the IC-chip very difficult. Further, in order to minimize the time required for burn-in, it is also desirable to keep the temperature of the IC-chip as high as possible without damaging the IC-chip.

A "class" test usually follows the burn-in test. Here, the IC-chips are speed sorted and the basic function of each IC-chip is verified. During this test, power dissipation in the IC-chip can vary wildly as the IC-chip is sent a stream of test signals. Because the operation of an IC-chip slows down as the temperature of the IC-chip increases, very tight temperature control of the IC-chip is required throughout the class test. This insures that the speed at which the IC-chip operates is measured precisely at a specified temperature. If the IC-chip temperature is too high, the operation of the IC-chip will get a slower speed rating. Then the IC-chip will be sold as a lower priced part.

In the prior art, the present inventors have already disclosed a system which will maintain the temperature of an IC-chip at a set-point as the IC-chip undergoes the above described "burn-in" test and "class" test. This prior art system is disclosed in U.S. Pat. No. 5,812,505 which is entitled "TEMPERATURE CONTROL SYSTEM FOR AN ELECTRONIC DEVICE WHICH ACHIEVES A QUICK RESPONSE BY INTERPOSING A HEATER BETWEEN THE DEVICE AND A HEAT SINK." All of the details of that patent are herein incorporated by reference.

However, even though the system of patent '505 does in fact control the temperature of an IC-chip very accurately, the present inventors have now discovered one particular technical drawback with that system. This drawback has nothing to do with the accuracy at which the temperature of the IC-chip is maintained, and it is explained herein in the Detailed Description in conjunction with FIGS. 5–10.

Accordingly, the primary object of the present invention is to provide a novel temperature control system for an IC-chip which addresses and solves a technical drawback in system of patent '505.

BRIEF SUMMARY OF THE INVENTION

The present invention is a dual feedback control system for maintaining the temperature of an IC-chip near a set-point while the IC-chip dissipates a varying amount of electrical power. This system includes an evaporator for a liquid refrigerant and an electric heater which has one face connected to the evaporator and an opposite face for contacting the IC-chip. Also, this system includes an evaporator controller coupled to the evaporator, and a heater controller coupled to the electric heater. Further, the heater controller includes a first feedback circuit which sends electrical power to the electric heater with a variable magnitude that compensates for changes in the electrical power which the IC-chip dissipates. In addition, the evaporator controller includes a second feedback circuit which passes the liquid refrigerant into the evaporator with a variable flow rate that reduces electrical power usage in the heater over the power usage which otherwise occurs if the flow rate of the refrigerant is fixed.

Two numerical examples, which illustrate the magnitude of the power savings that is achieved with the second feedback circuit, are provided herein in FIGS. 5–10. In the example of FIGS. 5–7, electrical power usage in the heater is reduced by 61%. In the example of FIGS. 8–10, electrical power usage in the heater is reduced by 66%. This power savings is in comparison to the above referenced prior art temperature control system of U.S. Pat. No. 5,821,505.

In on particular embodiment, the second feedback circuit senses the instantaneous power to the electric heater. Then the second feedback circuit sends the liquid refrigerant to the evaporator with a flow rate that—a) decreases if the average of the sensed power to the electric heater over a certain time interval is above an upper power limit, and b) increases if the average over the time interval is below a lower power limit.

In another particular embodiment, the second feedback circuit senses the temperature of the evaporator. Then the second feedback circuit sends the liquid refrigerant to the evaporator with a flow rate that—a) decreases if the set-point minus the temperature of the evaporator is more than a maximum difference, and b) increases if the set-point minus the temperature of the evaporator is less than a minimum difference.

BRIEF DESCRIPTION OF THE DRAWINGS

FIG. 2 is a schematic diagram that shows where electrical power and thermal power flow through the system of FIG. 1.

FIG. 3 is the same as the schematic diagram of FIG. 2 except that various items in FIG. 3 are assigned numerical values.

FIG. 4 shows a set of equations which determine the power to the heater in the schematic diagram of FIG. 3.

DETAILED DESCRIPTION

Figure 1:
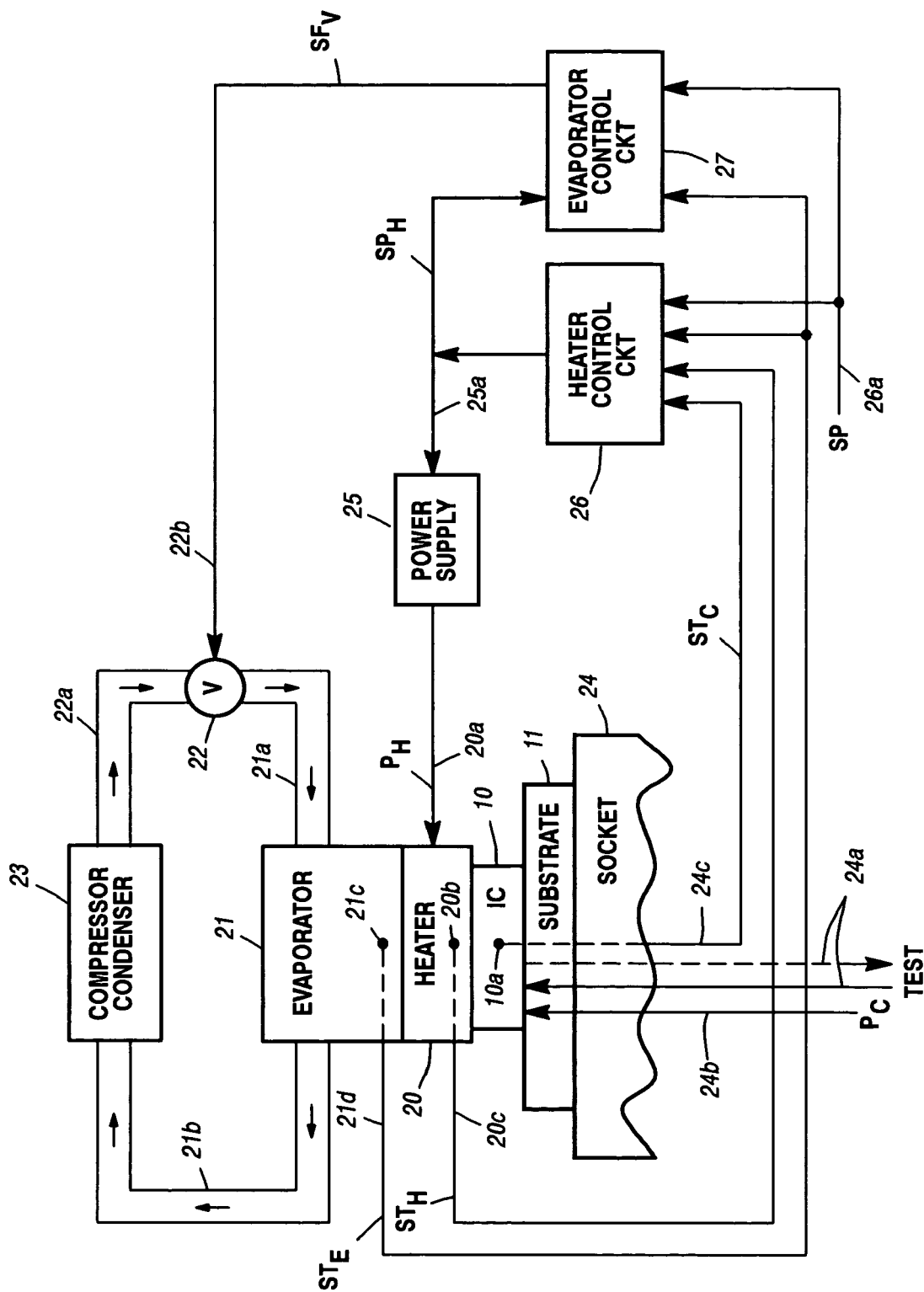
FIG. 1 shows a dual feedback control system for maintaining the temperature of an IC-chip near a set-point, which is one preferred embodiment of the present invention.

A dual feedback control system for maintaining the temperature of an IC-chip near a set-point, which is one preferred embodiment of the present invention, will now be described in conjunction with FIG. 1. In that figure, item 10 is the IC-chip whose temperature is being maintained, and item 11 is a substrate on which the IC-chip is attached. All of the remaining components in FIG. 1 comprise the dual feedback control system, and these components are identified below in TABLE 1.

TABLE 1

| Component | Description |
|---|---|
| 20 | Component 20 is a thin, flat electric heater. The heater 20 has one flat face which contacts the IC-chip 10, and it has an opposite flat face which is connected directly to component 21. Electrical power $P_H$ is sent to the heater 20 on conductors 20a. The temperature of the heater 20 is detected by a sensor 20b in the heater 20. This temperature is indicated by a signal $ST_H$ on conductors 20c. |
| 21 | Component 21 is an evaporator for a refrigerant. The refrigerant enters the evaporator 21 in a liquid state through a conduit 21a, and the refrigerant exits the evaporator 21 in a gas state through a conduit 21b. The temperature of the evaporator 21 is detected by a sensor 21c on the exterior of the evaporator. This temperature is indicated by a signal $ST_E$ on conductors 21d. |
| 22 | Component 22 is a valve which receives the refrigerant in a liquid state from a conduit 22a, and which passes that refrigerant at a selectable flow rate to the conduit 21a. The flow rate through the valve 22 is selected by a control signal $SF_V$ on conductors 22b. In one embodiment, the signal $SF_V$ is a pulse modulated signal, and the valve 22 opens for the duration of each pulse. In another embodiment, the signal $SF_V$ is an amplitude modulated analog signal, and the valve 22 opens to a degree that is proportional to the amplitude of the signal. |
| 23 | Component 23 is a compressor-condenser which has an input that is connected to conduit 21b, and an output that is connected to conduit 22a. The compressor-condenser 23 receives the refrigerant in the gas state, and then compresses and condenses that refrigerant to the liquid state. |
| 24 | Component 24 is a socket which holds the substrate 11. Electrical conductors 24a, 24b and 24c pass through the socket to the IC-chip 10. The conductors 24a carry test signals to and from the IC-chip 10. The conductors 24b carry electrical power $P_E$ to the IC-chip 10. The conductors 24c carry signals $ST_C$ which indicate the temperature of the IC-chip 10. These signals $ST_C$ are generated by a temperature sensor 10a that is integrated into the IC-chip 10. |
| 25 | Component 25 is a power supply which sends the power $P_H$ to the electric heater 20 with a selectable magnitude. The amount of power that is sent at any instant is selected by a signal $SP_H$ on conductors 25a. |
| 26 | Component 26 is a control circuit for the heater power supply 25. This control circuit 26 generates the signal $SP_H$ on the conductors 25a in response to the signals $ST_E$, $ST_H$, $ST_C$, and SP which it receives on the conductors 21d, 20c, 24c and 26a. The signal SP indicates a set-point temperature at which the IC-chip 10 is to be maintained. The control circuit 26, together with the power supply 25 and the electric heater 20, form a first feedback loop in the FIG. 1 control system. This first feedback loop quickly compensates for changes in power dissipation in the IC-chip 10 |

TABLE 1-continued

| Component | Description |
|---|---|
| | and thereby maintains the temperature of the IC-chip 10 near the set-point. |
| 27 | Component 27 is a control circuit for the valve 22. This control circuit 27 generates the signal $SF_V$ on the conductors 22b in response to the signals $SP_H$, $ST_E$, and SP which it receives on the conductors 25a, 21d, and 26a. The control circuit 27, together with the valve 22 and the evaporator 21, form a second feedback loop in the FIG. 1 control system. This second feedback loop passes the liquid refrigerant through the evaporator with a variable flow rate that reduces the overall usage of electrical power in the FIG. 1 system. |

Next, with reference to FIGS. 2–11, additional details will be described on how the first and second feedback loops operate. To begin, reference should be made to FIG. 2 which is a schematic diagram that shows where electrical power and thermal power flow through the FIG. 1 system in the steady state. Several symbols are used in FIG. 2, and those symbols are defined below in TABLE 2.

TABLE 2

| Symbol | Meaning |
|---|---|
| $P_C$ | $P_C$ is the instantaneous electrical power that is sent to the IC-chip 10. This power varies in a random manner in response to the TEST signals in FIG. 1. This power also varies in proportion to the DC voltage level at which the power is sent. The DC voltage level can be increased above a normal level, during some tests, in order to catch certain types of failures in the IC-chip 10. |
| $P_H$ | $P_H$ is the instantaneous electrical power that is sent to the heater 20. |
| $T_C$ | $T_C$ is the instantaneous temperature of the IC-chip 10. |
| $T_H$ | $T_H$ is the instantaneous temperature of the heater 20. |
| $T_E$ | $T_E$ is the instantaneous temperature of the evaporator 21. |
| $\theta(C-H)$ | $\theta(C-H)$ is the thermal resistance between the IC-chip 10 and the heater 20. |
| $\theta(H-E)$ | $\theta(H-E)$ is the thermal resistance between the heater 20 and the evaporator 21. |

In the steady-state (which is shown in FIG. 2) $T_C$ is at the set-point temperature, and the temperatures $T_H$ and $T_E$ are progressively colder. Also in the steady-state, thermal power flows from the IC-chip 10 to the refrigerant along the path 31, and thermal power flows from the heater 20 to the refrigerant along the path 32. Further in the steady-state, the thermal power on path 31 equals the electrical power $P_C$ that is sent to the IC-chip 10, and the thermal power on path 32 equals the electrical power $P_H$ that is sent to the heater 20.

Suppose now that $P_C$ increases to a higher level $P_C(+)$. Then, in response, $T_C$ will tend to rise above the set-point. But to compensate for that effect, the heater control circuit 26 will decrease $P_H$. In response, $T_H$ will drop, and that will keep the IC-chip 10 at the set-point while it dissipates the higher level of power $P_C(+)$.

Conversely, suppose that $P_C$ decreases to a lower power level $P_C(-)$. Then in response, $T_C$ will tend to drop below the set-point. But to compensate for that effect, the heater control circuit 26 will increase $P_H$. In response, $T_H$ will rise, and that will keep the IC-chip 10 at the set-point while it dissipates the decreased level of power $P_C(-)$.

A numerical example of how to determine the particular heater power $P_H$ which will keep $T_C$ at the set-point, under steady-state conditions, is shown in FIGS. 3 and 4. In FIG. 3, the IC-chip 10 is at a set-point of 25° C., and the temperature of the evaporator is −5° C. Also in FIG. 3, the thermal resistances $\theta(C-H)$ and $\theta(H-E)$ are 0.1° C./W, and 0.05° C./W respectively.

The particular heater power $P_H$ which will keep the IC-chip 10 at the set-point in FIG. 3 is calculated by equations 1–4 in FIG. 4. Equation 1 says that the temperature drop from $T_C$ to $T_E$ is equal to $P_C$ times all of the thermal resistance in path 31, plus $P_H$ times all of the thermal resistance in path 32. Then equation 2 is obtained by substituting numerical values from FIG. 3 into equation 1. Next equation 3 is obtained by adding and subtracting the various numerical values that occur in equation 2. Then equation 4 is obtained by solving equation 3 for the heater power $P_H$. From equation 4, the heater power $P_H$ is calculated to be 150 watts.

Figures 5, 6, 7:
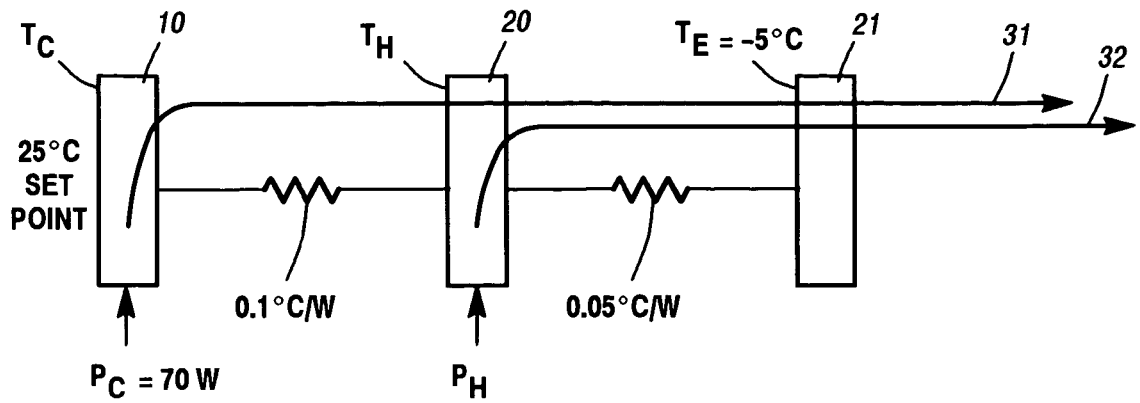
FIG. 5 is the same as the schematic diagram of FIG. 3 except that the power which the IC-chip dissipates in FIG. 5 is decreased from 150 watts to 70 watts.
FIG. 6 is a set of equations which determine the power to the heater in the schematic diagram of FIG. 5.
FIG. 7 is a set of equations which determine the power to the heater in the schematic diagram of FIG. 5 under the condition where the evaporator control circuit in FIG. 1 changes the temperature of the evaporator from −5° C. to +7° C.

Now, suppose that the IC-chip power $P_C$ decreases from 150 watts as shown in FIG. 3 to 70 watts as shown in FIG. 5. When that occurs, the power $P_H$ to the electric heater must increase in order to keep the temperature of the IC-chip 10 at the set-point. The particular heater power $P_H$ which keeps the IC-chip 10 at the set-point in the steady-state is calculated by equations 10–12 in FIG. 6.

Equation 10 says that the temperature drop from $T_C$ to $T_E$ is equal to $P_C$ times the thermal resistance in path 31, plus $P_H$ times the thermal resistance in path 32. Then equation 11 is obtained by adding and subtracting the various numerical values that occur in equation 10. Then equation 12 is obtained by solving equation 11 for the heater power $P_H$. From equation 12, the heater power $P_H$ is calculated to be 390 watts.

If the above drop in IC-chip power from 150 watts to 70 watts is just a transient that occurs as part of the random changes in $P_C$ due to the TEST signals, then the evaporator control circuit 27 does nothing in response. Conversely, if the average of the heater power during a predetermined interval ΔT stays at 390 watts, then the evaporator control circuit 27 responds by lowering the flow rate of the refrigerant to the evaporator 21, which raises the temperature $T_E$ of the evaporator 21.

Raising $T_E$ makes the operation of the FIG. 1 system more efficient. A numerical example of this is shown by equations 13–16 of FIG. 7.

Equation 13 says that $T_E$ is raised from −5° C. to +7° C. The evaporator control circuit 27 does this by generating the signal $SF_V$ in FIG. 1 such that the flow rate of the refrigerant through the valve 22 is reduced. As that flow rate drops, the temperature $T_E$ increases because less refrigerant changes from a liquid to a gas in the evaporator 21.

Equation 14 says that the temperature drop from $T_C$ to $T_E$ is equal to $P_C$ times the thermal resistance in path 31, plus $P_H$ times the thermal resistance in path 32. Then equation 15 is obtained by adding and subtracting the various numerical values that occur in equation 14. Then, equation 16 is obtained by solving equation 15 for the heater power $P_H$. From equation 16, the heater power $P_H$ is calculated to be 150 watts.

Comparing equation 16 with equation 12 indicates that 240 watts are saved due to the operation of the evaporator control circuit 27. In other words, the second control loop in the FIG. 1 system reduces electrical power consumption in the heater 20 from 390 watts to 150 watts, or 61%.

Also in the FIG. 1 system, the compressor-condenser 23 must work harder as the heater power is increased. Thus, additional power is saved by the compressor-condenser when the heater power is only 150 watts, as compared to being 390 watts.

In the prior art temperature control system of U.S. Pat. No. 5,812,505 (which is referenced herein in the BACKGROUND), there is no second control loop. In the '505 system, liquid coolant flows through a heatsink at a constant flow rate and a constant temperature. Thus when the IC-chip power drops from 150 watts to 70 watts in the '505 system, the electrical power which is sent to the heater to compensate for that drop is determined by equations 10–12 in FIG. 6.

Next, suppose that the system of FIG. 1 is again operating under the previously described steady-state conditions that are shown in FIG. 3. Then, consider what happens if the set-point temperature is increased from 25° C. to 40° C. When that change in set-point occurs, the steady-state operation that is shown in FIG. 5 changes to the steady-state operation that is shown in FIG. 8.

Figures 8, 9, 10:
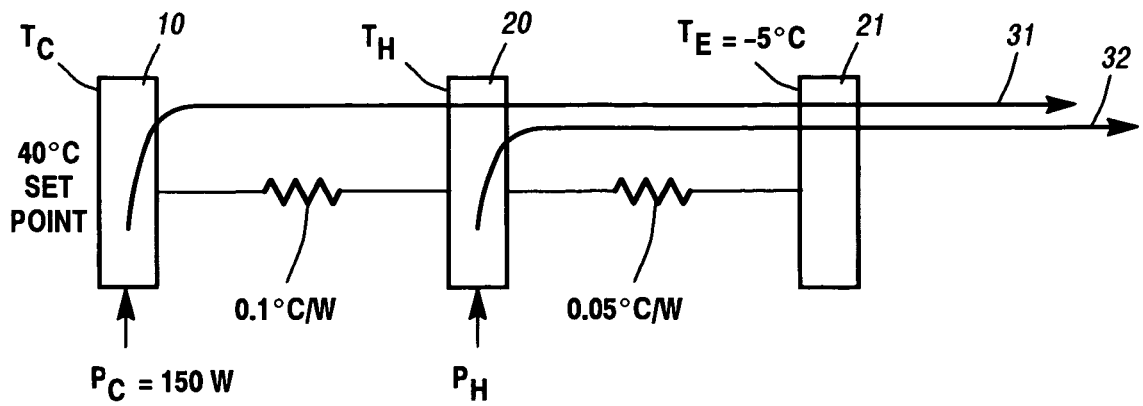
FIG. 8 is the same as the schematic diagram of FIG. 3 except that the set-point for the IC-chip is raised from 25° C. to 40° C.
FIG. 9 is a set of equations which determine the power to the heater in the schematic diagram of FIG. 8.
FIG. 10 is a set of equations which determine the power to the heater in the schematic diagram of FIG. 8 under the condition where the evaporator control circuit of FIG. 1 changes the temperature of the evaporator from −5° C. to +10° C.

The particular heater power $P_H$ in FIG. 8 which will keep the IC-chip 10 at the set-point in the steady-state is calculated by equations 20–22 in FIG. 9. Equation 20 says that the temperature drop from $T_C$ to $T_E$ is equal to $P_C$ times the thermal resistance in path 31, plus $P_H$ times the thermal resistance in path 32. Then equation 21 is obtained by adding and subtracting the various numerical values that occur in equation 20. Then equation 22 is obtained by solving equation 21 for the heater power $P_H$. From equation 22, the heater power $P_H$ is calculated to be 450 watts.

The above rise in heater power from 150 watts in FIG. 3 to 450 watts in FIG. 8 is not just a transient that occurs as part of the random changes in $P_C$ due to the TEST signals. Thus the evaporator control circuit 27 responds by raising the temperature $T_E$ of the evaporator 21 to again make the operation of the FIG. 1 system more efficient. A numerical example of this is shown by equations 23–26 of FIG. 10.

Equation 23 says that $T_E$ is raised from −5° C. to +10° C. The evaporator control circuit 27 does this by generating the signal $SF_V$ in FIG. 1 such that the flow rate of the refrigerant through the valve 22 is reduced. Equation 24 says that the temperature drop from $T_C$ to $T_E$ is equal to $P_C$ times the thermal resistance in path 31, plus $P_H$ times the thermal resistance in path 32. Next equation 25 is obtained by adding and subtracting the various numerical values that occur in equation 24. Then equation 26 is obtained by solving equation 25 for the heater power $P_H$. From equation 26, the heater power $P_H$ is calculated to be 150 watts.

Comparing equation 26 with equation 22 indicates that 300 watts are saved due to the operation of the evaporator control circuit 27. Thus, the second control loop in the FIG. 1 system reduced electrical power consumption in the heater 20 from 450 watts to 150 watts, or 66%. Here again, additional power is also saved by the compressor-condenser 23 since it does not have to work as hard when the heater power is only 150 watts instead of being 450 watts.

By comparison, in the prior art temperature control system of U.S. Pat. No. 5,812,505, liquid coolant flows through a heatsink at a constant flow rate and a constant temperature. Thus when the set-point rises from 25° C. to 40° C. in the '505 system, the electrical power which is sent to the heater to compensate for that rise is determined by equations 20–22 in FIG. 9.

Figure 11:
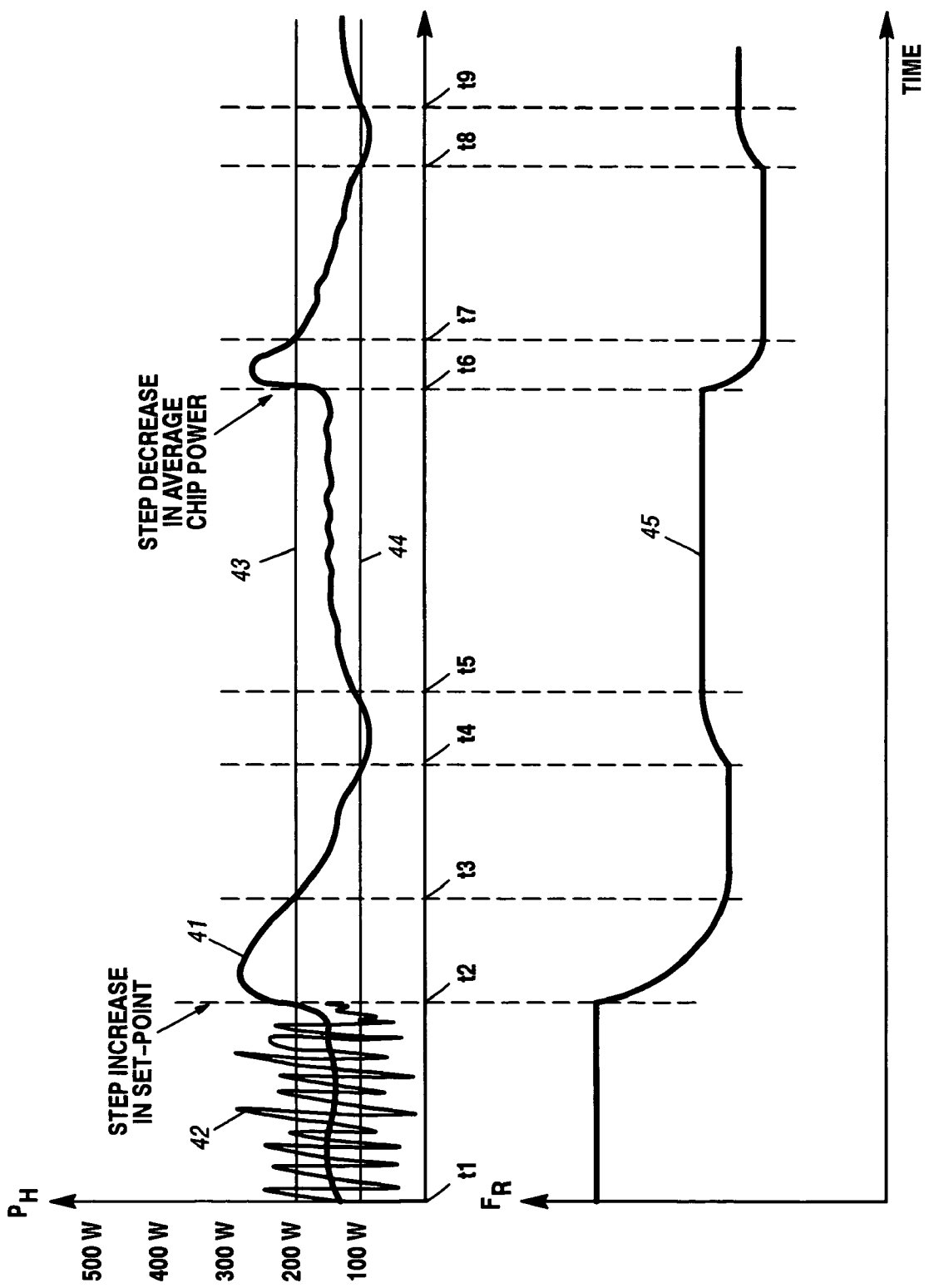
FIG. 11 is a diagram which shows how the heater control circuit in FIG. 1 and the evaporator control circuit in FIG. 1 operate over time.

Next, reference should be made to FIG. 11 which shows how the heater control circuit 26 and the evaporator control circuit 27 operate over time. In FIG. 11, time increases from left to right on the horizontal axis. Also in FIG. 11, a waveform 41 illustrates the running average of the power that is sent to the heater 20. This average at any time t is taken during a time interval $\Delta T$ that ends at time t.

Further in FIG. 11, a waveform 42 illustrates the instantaneous power that is sent to heater 20. This instantaneous power is rapidly increased by the heater control circuit 26 when $T_C$ starts to fall below the set-point, and it is rapidly decreased when $T_C$ starts to rise above the set-point. Consequently, $T_C$ always stays at, or near, the set-point.

To simplify FIG. 11, the instantaneous heater power as indicated by waveform 42 is shown only from time t1 to time t2; whereas the average heater power as indicated by waveform 41 is shown from time t1 to time t9. It is to be understood that the rapid changes in waveform 42 are superimposed on waveform 41 from time t2 to time t9, just like they are from time t1 to time t2.

Further in FIG. 11, reference numerals 43 and 44 respectively illustrate an upper limit and lower limit for the average heater power. Signals which represent the two limits 43 and 44 are stored within the evaporator control circuit 27.

When the average heater power 41 rises above the upper limit 43, then the evaporator control circuit 27 decreases the flow-rate $F_R$ of the refrigerant to the evaporator 21. Conversely, when the average heater power 41 drops below the lower limit 44, then the evaporator control circuit 27 increases the flow rate $F_R$ of the refrigerant to the evaporator 21. The flow rate $F_R$ is shown by waveform 45 in FIG. 11.

From time t1 to time t2 in FIG. 11, the average heater power 41 stays within the limits 43 and 44. Thus the evaporator control circuit 27 makes no change to the flow rate $F_R$.

Then, at time t2, a step increase occurs in the set-point temperature. Thus a large difference occurs between the set-point temperature and the temperature $T_C$ of the IC-chip 10. In response, the heater control circuit 26 increases the average power 41 to the heater 20.

Also, the evaporator control circuit 27 reacts to step changes in the set-point temperature. Specifically, the evaporator control circuit 27 sends the liquid refrigerant to the evaporator 21 with a flow rate that—a) decreases if the set-point minus the temperature of the evaporator 21 steps above an upper limit, and b) increases if the set-point minus the temperature of the evaporator 21 steps below a lower limit. One suitable upper limit is 50° C., and one suitable lower limit is 30° C.

In FIG. 11, the evaporator control circuit 27 decreases the flow rate $F_R$ of refrigerant as shown by waveform 45 from time t2 to time t3. As the flow rate FR decreases, the temperature $T_E$ of the evaporator increases. Thus a decrease occurs in the average heater power 41 which is required to keep the IC-chip 10 at the set-point, in the steady-state.

At time t3, the average heater power 41 falls below the upper limit 43. When that occurs, the vaporator control circuit 27 stops changing the flow rate $F_R$ of the refrigerant.

From time t3 to time t4, the average heater power 41 slowly drops from the upper limit 43 to the lower limit 44. This indicates that the flow rate $F_R$ that was set at time t3 is too low.

Thus from time t4 to time t5, the evaporator control circuit 27 reacts by increasing the flow rate $F_R$ as shown by waveform 45. This lowers the temperature $T_E$ of the evaporator 21. In response, the heater control circuit 26 increases the average heater power 41 in order to keep the IC-chip 10 at the set-point SP in the steady-state.

At time t5, the average heater power 41 rises above the lower limit 44. When that occurs, the evaporator control circuit 27 stops changing the flow rate $F_R$ of the refrigerant.

Thereafter, from time t5 to time t6, the average heater power 41 stays within the two limits 43 and 44. Thus no change occurs in the flow rate $F_R$.

Next, at time t6, a step decrease occurs in the average power $P_C$ to the IC-chip 10. This can be caused by a step decrease in the DC voltage at which the power is sent to the IC-chip 10. This also can be caused by a change from one sequence of TEST signals to another sequence of TEST signals which switches fewer transistors within the IC-chip 10.

In response to the above power decrease, the temperature of the IC-chip 10 starts to drop below the set-point. That temperature drop is sensed by the heater control circuit 26 which reacts by quickly increasing the average heater power 41.

When the average heater power 41 rises above the upper limit 43, the evaporator control circuit 27 responds by decreasing the flow rate $F_R$ of the refrigerant. This is shown by waveform 45 from time t6 to time t7. Due to that decreased flow rate, the temperature of the evaporator 21 increases. This increased evaporator temperature allows the average heater power 41 to be lowered and still maintain the IC-chip 10 at the set-point in the steady-state.

Between time t7 and time t8, the average heater power 41 slowly drops from the upper limit 43 to the lower limit 44. This indicates that the flow rate $F_R$ was set too low at time t7.

Thus from time t8 to time t9, the evaporator control circuit 27 reacts by increasing the flow rate $F_R$ as shown by waveform 45. In response, the evaporator temperature $T_E$ decreases. Thus the heater control circuit 26 increases the average heater power 41 in order to keep the IC-chip 10 at the set-point in the steady-state.

At time t9, the average heater power 41 rises above the lower limit 44. When that occurs, the evaporator control circuit 27 stops changing the flow rate $F_R$. Thereafter, the average heater power 41 stays within the two limits 43 and 44, so the evaporator control circuit 27 makes no change in the flow rate $F_R$.

Next, with reference to FIG. 12, one preferred embodiment of the internal structure of the evaporator control circuit 27 will be described. This FIG. 12 embodiment includes all of the components 51–66, and those components are identified below in TABLE 3.

TABLE 3

| Component | Description |
| --- | --- |
| 51 | Component 51 is a register which holds digital signals that specify the upper limit for the average heater power. Suitably, this upper limit is 250 watts as one example, as shown in FIG. 12. Preferably, the upper limit is at least twice the lower limit. |
| 52 | Component 52 is a register which holds digital signals that specify the lower limit for the average heater power. Preferably, this lower limit is not less than 50 watts, as shown in FIG. 12. |
| 53 | Component 53 is a register which holds digital signals that specify the time period ΔT during which the running average of the heater power is determined. Preferably, this time period is in the range of 0.5 to 10 seconds. |
| 54 | Component 54 is a circuit which determines the running average of the heater power. An output signal S1 from circuit 54 indicates this average. One particular embodiment of circuit 54 is a digital low pass filter which samples the instantaneous heater power during the time interval ΔT. |
| 55 | Component 55 is an arithmetic circuit which subtracts its negative input from its positive input. An output signal S2 from circuit 55 indicates this difference. |
| 56a, 56b . . . | Components 56a and 56b respectively are a diode and a resistor which together generate a signal S3. The signal S3 equals the signal S2 when the signal S2 is greater than zero. Otherwise, signal S3 equals zero. |
| 57 | Component 57 is an arithmetic circuit which subtracts its negative input from its positive input. An output signal S4 from circuit 57 indicates this difference. |
| 58a, 58b . . . | Component 58a and 58b respectively are a diode and a resistor which together generate a signal S5. The signal S5 equals the signal S4 when the signal S4 is greater than zero. Otherwise, signal S5 equals zero. |
| 59 | Component 59 is a register which holds digital signals that specify the upper limit for the set-point temperature minus the |

TABLE 3-continued

| Component | Description |
|---|---|
| | temperature of the evaporator 21. Preferably, this upper limit does not exceed 50° C., as shown in FIG. 12. |
| 60 | Component 60 is a register which holds digital signals that specify the lower limit for the set-point temperature minus the temperature of the evaporator 21. Preferably, this lower limit is at least 30° C., as shown in FIG. 12. |
| 61 | Component 61 is an arithmetic circuit which subtracts its negative input from its positive input. An output signal S6 from circuit 61 indicates this difference. |
| 62 | Component 62 is an arithmetic circuit which subtracts its negative input from its positive input. An output signal S7 from circuit 62 indicates this difference. |
| 63a, 63b . . . | Component 63a and 63b respectively are a diode and a resistor which together generate a signal S8. The signal S8 equals the signal S7 when the signal S7 is greater than zero. Otherwise, signal S8 equals zero. |
| 64 | Component 64 is an arithmetic circuit which subtracts its negative input from its positive input. An output signal S9 from circuit 64 indicates this difference. |
| 65a, 65b . . . | Component 65a and 65b respectively are a diode and a resistor which together generate a signal S10. The signal S10 equals the signal S9 when the signal S9 is greater than zero. Otherwise, signal S10 equals zero. |
| 66 | Component 66 is a circuit which generates the signal $SF_V$ in response to the signals S3, S5, S8 and S10. How this is done is described below. |

Figure 12:
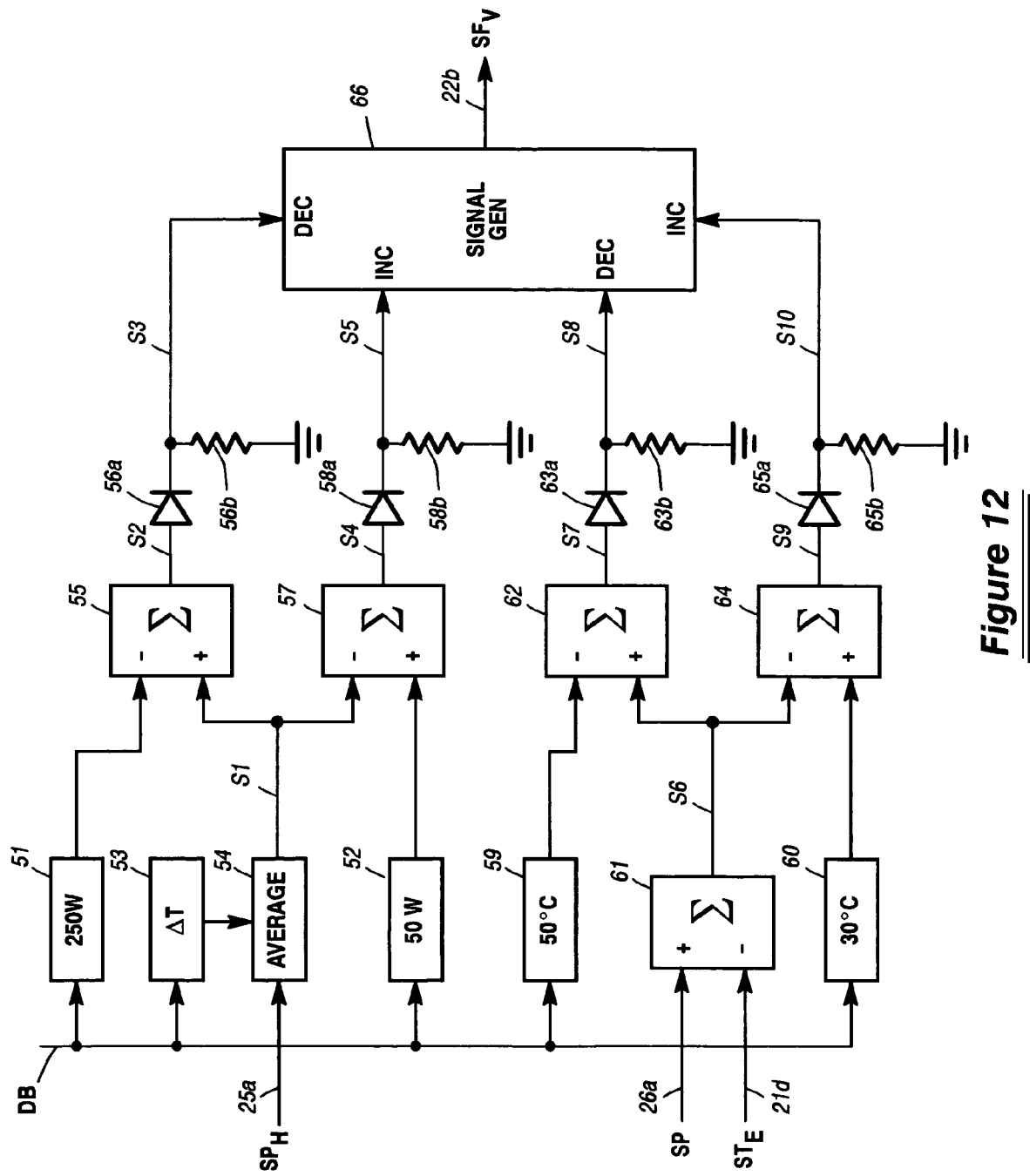
FIG. 12 shows one preferred embodiment of the internal structure of the evaporator control circuit in FIG. 1.

The operation of the FIG. 12 circuit begins by loading all of the registers 51, 52, 53, 59, and 60 with their parameters. To do this, the registers 51, 52, 53, 59, and 60 are sequentially sent their parameters via a time-shared data bus DB. The particular parameter values are selected by an operator and sent from the operator's terminal (not shown).

Thereafter, the signals $SP_H$, SP, $ST_E$ are continually received by components 54 and 61. Then in response, those signals are continually processed by components 54, 55, 56a, 56b, 57, 58a, 58b, 61, 62, 63a, 63b, 64, 65a, and 65b. In that manner, the signals S3, S5, S8 and S10 are continually generated.

Signal S3 indicates the degree to which the flow rate through valve 22 should be decreased when heater power is too high. Conversely, signal S5 indicates the degree to which the flow rate through valve 22 should be increased when heater power is too low.

Signal S8 indicates the degree to which the flow rate through valve 22 should be decreased when the evaporator temperature is too far below the set-point. Conversely, signal S10 indicates the degree to which the flow rate through valve 22 should be increased when the evaporator temperature is too close to the set-point.

A flow rate increase that is indicated by signal S5 is offset by a flow rate decrease that is indicated by signal S8. Likewise, a flow rate increase that is indicated by signal S10 is offset by a flow rate decrease that is indicated by signal S3.

When the net of all of the signals S3, S5, S8, and S10 indicates that the flow rate through valve 22 is too low, then circuit 66 changes the signal $SF_V$ in a manner which increases that flow rate. Likewise, when the net of all of the signals S3, S5, S8, and S10 indicates that the flow rate through valve 22 is too high, then circuit 66 changes the signal $SF_V$ in a manner which decreases that flow rate. At all other times, when the signals S3, S5, S8, and S10 are zero, then circuit 66 makes no change to the signal $SF_V$.

Suitably, the signal $SF_V$ is generated as a pulse modulated signal which opens valve 22 completely for the time duration of each pulse in the signal. Alternatively, the signal $SF_V$ is generated as an amplitude modulated signal which opens valve 22 to a degree that is proportional to the amplitude of the signal.

One preferred embodiment of a dual feedback control system, for maintaining the temperature of an IC-chip near a set-point, has now been described in detail. Now, several modifications which can be made to that embodiment, without departing from the scope of the invention, will be described.

As one modification, the IC-chip 10 whose temperature is being maintained near the set-point can be in any type of "chip-package". In FIG. 1, the IC-chip 10 is shown as being packaged on just the substrate 11. Alternatively, the IC-chip 10 can be "unpackaged" and held directly by the socket 14. Also alternatively, the IC-chip 10 on the substrate 11 can be completely enclosed with a cover. Thus, the heater 20 in FIG. 1 can contact an IC-chip directly or contact a cover which encloses the IC-chip.

As another modification, the IC-chip 10 whose temperature is being maintained near the set-point, can either include or not include its own temperature sensor. In FIG. 1, the IC-chip 10 is shown as including its own temperature sensor 10a. However, if the IC-chip 10 does not have such a temperature sensor, then the heater control circuit 26 can estimate the temperature $T_C$ of the IC-chip 10 by monitoring the temperature of the heater 20 via signal $ST_H$ and the temperature of the evaporator via signal $ST_E$. How this estimation is performed is disclosed by the present inventors in U.S. Pat. No. 5,844,208 which is entitled "TEMPERATURE CONTROL SYSTEM FOR AN ELECTRONIC DEVICE IN WHICH DEVICE TEMPERATURE IS ESTIMATED FROM HEATER TEMPERATURE AND HEAT SINK TEMPERATURE".

As still another modification, the system of FIG. 1 can be expanded such that a plurality of N IC-chips 10 simultaneously have their respective temperature maintained near a respective set-point. In this expanded system, all of the components 20–22 and 24–27 are replicated N times. The compressor-condenser 23 may occur one or more times, as desired. The refrigerant is sent in a liquid state from the compressor-condenser(s) 23 to all of the replicated valves 22, and the refrigerant is returned in a gas state from all of the replicated evaporators 21 to the compressor-condenser(s) 23.

Further, as another modification, the particular evaporator control circuit 27 that is shown in FIG. 12 can be simplified. One simplification is made by fixing all of the parameters that are held in the registers 51, 52, 53, 59, and 60. Those fixed parameters are then built into components 54, 55, 57, 62, and 64. This enables all of the registers 51, 52, 53, 59, and 60, as well as the data bus DB, to be eliminated.

A second simplification to the evaporator control circuit of FIG. 12 is made by eliminating all of the components that generate the signals S8 and S10. These are components 59, 60, 61, 62, 63a, 63b, 64, 65a, and 65b. With this modification, the electrical power which is used by the heater 20 is still reduced in comparison to a system where the flow-rate through the valve 22 is fixed. However, the power savings may not be as large as that which is achieved with the control circuit of FIG. 12.

Similarly, a third simplification to the evaporator control circuit of FIG. 12 is made by eliminating all of the components that generate the signals S3 and S5. Those are components 51, 52, 53, 54, 55, 56a, 56b, 57, 58a, and 58b. Here again, with this modification, the electrical power which is used by the heater 20 is still reduced in comparison to a system where the flow-rate through the valve 22 is fixed. However, the power savings may not be as large as that which is achieved with the control circuit of FIG. 12.

A fourth simplification to the evaporator control circuit of FIG. 12 is that the upper power limit which is held in register 51 and the lower power limit which is held in register 52 can be the same. In that case, register 52 can be eliminated, and the output of register 51 is sent to the positive input of the arithmetic circuit 57 as well as the negative input of the arithmetic circuit 55. Similarly, the upper limit of the temperature difference which is held in register 59 can be the same as the lower limit of the temperature difference that is held in register 60. In that case, register 60 can be eliminated, and the output of register 59 is sent to the positive input of the arithmetic circuit 64 as well as the negative input of the arithmetic circuit 62.

Also, each of the components 51–66 in the evaporator control circuit 27 that are shown in FIG. 12 can be implemented in any desired fashion. For example, each of the arithmetic circuits 55, 57, 61, 62, and 64 can be a digital arithmetic circuit which subtracts digital signals, or an analog arithmetic circuit which subtracts analog signals. As another example, the diode-resistor pairs 56a–56b, 58a–58b, 63a–63b, and 65a–65b can be implemented as any circuit which passes the signals S2, S4, S7, and S9 when those signals are greater than zero, and otherwise generates a zero output. As still another example, the arithmetic circuits 55, 57, 62, and 64 can be implemented such that they produce a zero output when their negative input is larger in magnitude than their positive input, and then, the diode-resistor pairs 56a–56b, 58a–58b, 63a–63b, and 65a–65b can be deleted.

As another modification, the refrigerant which is used in the FIG. 1 system can be any substance which changes from a liquid phase to a gas phase in the evaporator. For example, these refrigerants can be fluorohydrocarbons such as fluoromethane or fluoroethane, or water, or liquid nitrogen, or any other liquid with suitable evaporative properties.

In view of the above, it is to be understood that the present invention is not limited to all of the details of just one particular embodiment, but is defined by the appended claims.

What is claimed is:

1. A dual feedback control system for maintaining the temperature of an IC-chip near a set-point while said IC-chip dissipates a varying amount of electrical power; said system being comprised of:
   an evaporator for a liquid refrigerant, and an electric heater which has one face that is connected directly to said evaporator and an opposite face for coupling to said IC-chip;
   an evaporator controller coupled to said evaporator, and a heater controller coupled to said electric heater;
   said heater controller including a first feedback circuit means for sending electrical power to said electric heater with a variable magnitude that compensates for changes in said IC-chip power; and,
   said evaporator controller including a second feedback circuit means for passing said liquid refrigerant to said evaporator with a variable flow rate that decreases as electrical power usage in said heater increases, and increases as electrical power usage in said heater decreases.

2. A dual feedback control system according to claim 1 wherein said electric heater generates heat with quick changes in magnitude in comparison to said evaporator controller which includes a valve that adjusts said flow rate of said liquid refrigerant with substantially slower changes in magnitude.

3. A dual feedback system according to claim 2 wherein said second feedback circuit means senses the instantaneous power to said electric heater, and sends said liquid refrigerant to said evaporator with a flow rate that -a) decreases if the average of the sensed power to said electric heater over a certain time interval is above an upper power limit, and b) increases if said average over said time interval is below a lower power limit.

4. A dual feedback system according to claim 3 wherein said upper power limit is at least twice said lower power limit.

5. A dual feedback system according to claim 2 wherein said second feedback circuit means senses the instantaneous power to said electric heater, and sends said liquid refrigerant to said evaporator with a flow rate that -a) decreases if the average of the sensed power to said electric heater over a certain time interval is above a particular power limit, and b) increases if said average over said time interval is below said particular power limit.

6. A dual feedback control system according to claim 2 wherein said second feedback circuit means senses the temperature of said evaporator, and sends said liquid refrigerant to said evaporator with a flow rate that -a) decreases if said set-point minus the temperature of said evaporator is more than a maximum difference, and b) increases if said set-point minus the temperature of said evaporator is less than a minimum difference.

7. A dual feedback control system according to claim 6 wherein said second feedback circuit keeps said evaporator 30° C. to 50° C. colder than the temperature of said IC-chip.

8. A dual feedback control system according to claim 2 wherein said second feedback circuit means senses the temperature of said evaporator, and sends said liquid refrigerant to said evaporator with a flow rate that -a) decreases if said set-point minus the temperature of said evaporator is more than a particular difference, and b) increases if said set-point minus the temperature of said evaporator is less than said particular difference.

9. A dual feedback control system according to claim 2 wherein said first feedback circuit means reads the temperature of said IC-chip from a sensor in said IC-chip, and sends electrical power to said electric heater with a magnitude that -a) increases as the temperature of said IC-chip decreases below said set-point and b) decreases as the temperature of said IC-chip increases above said set-point.

10. A dual feedback control system according to claim 2 wherein said first feedback circuit means estimates the temperature of said IC-chip as a function of the temperature from one sensor on said evaporator and another sensor on said electric heater, and sends electrical power to said electric heater with a magnitude that -a) increases as the temperature of said IC-chip decreases below said set-point and b) decreases as the temperature of said IC-chip increases above said set-point.

11. A dual feedback control system according to claim 2 wherein said evaporator controller includes a programmable member which stores signals that set an upper power limit and a lower power limit for said heater.

12. A dual feedback control system according to claim 2 wherein said second feedback circuit means determines average heater power usage by sensing and filtering instantaneous power sent to said electric heater.

13. A dual feedback control system according to claim 2 wherein the combination of said evaporator, said electric heater, said heater controller, and said evaporator controller are replicated in said system multiple times such that each combination maintains the respective temperature of a respective IC-chip near a respective set-point.

14. A dual feedback control system according to claim 2 wherein said evaporator controller opens and closes said valve with a pulse-modulated control signal.

15. A dual feedback control system according to claim 2 wherein said evaporator controller opens and closes said valve to a degree that is selected with the amplitude of an analog control signal.

16. A dual feedback control system for maintaining the temperature of an IC-chip near a set-point while said IC-chip dissipates a varying amount of electrical power; said system being comprised of:
   a fluid cooled means, and an electric heater which has one face that is connected directly to said fluid cooled means and an opposite face for coupling to said IC-chip;
   a fluid controller coupled to said fluid cooled means, and a heater controller coupled to said electric heater;
   said heater controller including a first feedback circuit means for sending electrical power to said electric heater with a variable magnitude that compensates for changes in said IC-chip power; and,
   said fluid controller including a second feedback circuit means for passing said fluid to said fluid cooled means with a variable flow rate that decreases as electrical power usage in said heater increases, and increases as electrical power usage in said heater decreases.

* * * * *